(12) United States Patent
Van De Ven et al.

(10) Patent No.: US 8,008,845 B2
(45) Date of Patent: Aug. 30, 2011

(54) LIGHTING DEVICE WHICH INCLUDES ONE OR MORE SOLID STATE LIGHT EMITTING DEVICE

(75) Inventors: Antony Paul Van De Ven, Hong Kong SAR (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/512,653

(22) Filed: Jul. 30, 2009

(65) Prior Publication Data
US 2010/0102697 A1    Apr. 29, 2010

Related U.S. Application Data

(60) Provisional application No. 61/108,130, filed on Oct. 24, 2008.

(51) Int. Cl.
*H01J 61/52* (2006.01)
*H01J 1/62* (2006.01)

(52) U.S. Cl. .......................... 313/46; 313/512

(58) Field of Classification Search .............. 313/46, 313/512, 110
See application file for complete search history.

(56) References Cited

U.S. PATENT DOCUMENTS

| | | | |
|---|---|---|---|
| 4,918,487 A | 4/1990 | Coulter, Jr. | |
| 5,631,190 A | 5/1997 | Negley | |
| 5,912,477 A | 6/1999 | Negley | |
| 5,924,785 A | 7/1999 | Zhang et al. | |
| 6,578,998 B2 | 6/2003 | Zhang | |
| 7,246,921 B2 | 7/2007 | Jacobson et al. | |
| 2006/0049335 A1 | 3/2006 | Suehiro et al. | |
| 2007/0139923 A1 | 6/2007 | Negley | |
| 2007/0139949 A1 | 6/2007 | Tanda et al. | |
| 2007/0171145 A1 | 7/2007 | Coleman | |
| 2007/0263393 A1 | 11/2007 | Van de Ven | |
| 2007/0279440 A1 | 12/2007 | Negley | |
| 2007/0279903 A1 | 12/2007 | Negley | |
| 2008/0054280 A1 | 3/2008 | Reginelli et al. | |
| 2008/0079019 A1 | 4/2008 | Huang et al. | |
| 2008/0084700 A1 | 4/2008 | Van de Ven | |
| 2008/0084701 A1 | 4/2008 | Van de Ven | |
| 2008/0088248 A1 | 4/2008 | Myers | |
| 2008/0106907 A1 | 5/2008 | Trott | |

(Continued)

FOREIGN PATENT DOCUMENTS

SE          527 683 C2     5/2006

(Continued)

OTHER PUBLICATIONS

LED Professional, *Everlight Releases Brand New 5 Watt High Power LED Series*, http://222.led-professional.com/content/view/877/29, Jan. 14, 2006, pp. 1-2.

(Continued)

*Primary Examiner* — Joseph L Williams
(74) *Attorney, Agent, or Firm* — Burr & Brown

(57) ABSTRACT

There is provided a lighting device which has at least one solid state light emitter and a substantially transparent heat sink. The heat sink and the solid state light emitter are positioned and oriented relative to one another such that if the solid state light emitter is illuminated, light emitted by the solid state light emitter which exits the lighting device passes through at least a portion of the heat sink. Also, there is provided a lighting device which has at least one solid state light emitter and means for extracting heat from the solid state light emitter.

60 Claims, 7 Drawing Sheets

U.S. PATENT DOCUMENTS

| | | |
|---|---|---|
| 2008/0112168 A1 | 5/2008 | Pickard |
| 2008/0112170 A1 | 5/2008 | Trott |
| 2008/0112183 A1 | 5/2008 | Negley |
| 2008/0137347 A1 | 6/2008 | Trott |
| 2008/0179622 A1 | 7/2008 | Herrmann |
| 2008/0278950 A1 | 11/2008 | Pickard |
| 2008/0278952 A1 | 11/2008 | Trott |
| 2008/0278957 A1 | 11/2008 | Pickard |
| 2008/0304269 A1 | 12/2008 | Pickard |
| 2008/0309255 A1 | 12/2008 | Myers |
| 2009/0184666 A1 | 7/2009 | Myers |

FOREIGN PATENT DOCUMENTS

| | | |
|---|---|---|
| WO | 2006/117710 | 11/2006 |

OTHER PUBLICATIONS

U.S. Appl. No. 12/886,718, filed Sep. 21, 2010, Van de Ven et al.
U.S. Appl. No. 13/022,142, filed Feb. 7, 2011, Van de Ven et al.

LIGHTING DEVICE WHICH INCLUDES ONE OR MORE SOLID STATE LIGHT EMITTING DEVICE

CROSS-REFERENCE TO RELATED APPLICATIONS

This application claims the benefit of U.S. Provisional Patent Application No. 61/108,130, filed Oct. 24, 2008, the entirety of which is incorporated herein by reference.

FIELD OF THE INVENTIVE SUBJECT MATTER

The present inventive subject matter relates to lighting devices. In some embodiments, the present inventive subject matter relates to lighting devices which include one or more solid state light emitting devices, e.g., light emitting diodes.

BACKGROUND

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), and/or duration of service.

A variety of solid state light emitters are well-known. For example, one type of solid state light emitter is a light emitting diode.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been addressed or fully met.

BRIEF SUMMARY OF THE INVENTIVE SUBJECT MATTER

As indicated above, the present inventive subject matter relates to lighting devices which comprise solid state light emitters, such as LEDs. Many solid state light emitters, however, do not operate well in high temperatures. LED light sources, for example, have operating lifetimes of decades (as opposed to just months or one or two years for many incandescent bulbs), but an LED's lifetime is usually significantly shortened if it operates at elevated temperatures. It is generally accepted that the junction temperature of an LED should not exceed 85 degrees C. if a long lifetime is desired.

In addition, the intensity of light emitted from some solid state light emitters varies based on ambient temperature. For example, LEDs which emit red light often have a very strong temperature dependence (e.g., AlInGaP LEDs can reduce in optical output by ~20% when heated up by ~40° C.), that is, approximately −0.5% per degree C.; and blue InGaN+YAG:Ce LEDs can reduce by about −0.15% per degree C.

In many cases (e.g., most residential applications), fixtures (e.g., "cans") are required to be substantially airtight around the sides and top to prevent the loss of ambient heat or cooling from the room into the ceiling cavity through the fixture. As the lamp is mounted in the can, much of the heat generated by the light source is trapped within the can, because the air heated in the can rises and is trapped within the can. Insulation is usually required around the can within the ceiling cavity to further reduce heat loss or cooling loss from the room into the ceiling cavity.

FIG. 1 conceptually depicts a representative example of a lighting device which includes one or more solid state lighting devices. The lighting device 10 depicted in FIG. 1 includes a heat sink 11, a solid state light emitter chip 12 and an encapsulant 13. In the lighting device 10 depicted in FIG. 1, the primary thermal path for removing heat generated by illuminating the solid state light emitter chip 12 is through the back or base of the solid state light emitter chip, i.e., downward in the orientation depicted in FIG. 1 (heat removal is depicted by the arrows).

The present inventive subject matter provides lighting devices in which heat generated by illuminating one or more solid state light emitter in the lighting devices can be removed in other directions as well, e.g., away from the front of the chip.

According to a first aspect of the present inventive subject matter, there is provided a lighting device which comprises at least one solid state light emitter and a substantially transparent heat sink, the heat sink and the solid state light emitter being positioned and oriented relative to one another such that if the solid state light emitter is illuminated, light emitted by the solid state light emitter which exits the lighting device passes through at least a portion of the heat sink.

According to a second aspect of the present inventive subject matter, there is provided a lighting device which comprises at least one solid state light emitter and a substantially transparent heat sink, at least some of the light emitted by the solid state light emitter passing through the heat sink.

According to a third aspect of the present inventive subject matter, there is provided a lighting device which comprises at least one solid state light emitter and means for extracting heat from the solid state light emitter.

The inventive subject matter may be more fully understood with reference to the accompanying drawings and the following detailed description of the inventive subject matter.

BRIEF DESCRIPTION OF THE DRAWINGS FIGURES

FIG. 1 conceptually depicts a representative example of a lighting device which includes one or more solid state lighting devices.

DETAILED DESCRIPTION OF THE INVENTIVE SUBJECT MATTER

Figure 1:
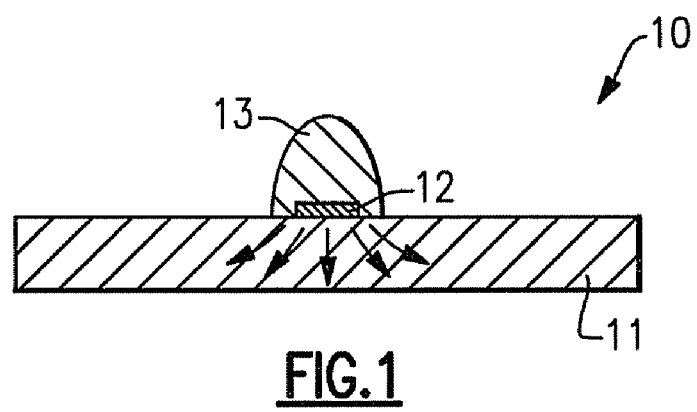

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In some of the lighting devices according to the present inventive subject matter, efforts are made to maximize the heat transfer area of the lighting device and/or the overall heat capacity of the lighting device, in particular, by maximizing the area of the heat sink (which is thermally coupled to the solid state light emitter(s)) and/or by maximizing the heat capacity of the heat sink. The expression "thermally coupled", as used herein, refers to components which readily transfer heat therebetween, e.g., components which are in contact with each other via a heat transfer gasket, thermal grease and/or thermal adhesive.

The expression "substantially transparent", as used herein, means that the structure which is characterized as being substantially transparent allows passage of at least 80% of incident visible light, and/or at least 80% of the light having a wavelength within the range emitted by the one or more solid state light emitters included in the lighting device.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another element as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, according to the present inventive subject matter, there is provided a lighting device which comprises at least one solid state light emitter and a substantially transparent heat sink.

Any desired solid state light emitter or emitters can be employed in accordance with the present inventive subject matter. Persons of skill in the art are aware of, and have ready access to, a wide variety of such emitters. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well-known in the art (and therefore it is not necessary to describe in detail such devices, and/or the materials out of which such devices are made). The one or more solid state light emitters can be selected based on the electromagnetic radiation (light) desired, e.g., they can emit infrared light, visible light, ultraviolet light, near ultraviolet light, etc., and any combinations thereof.

The respective light emitters can be similar to one another, different from one another, or any combination (i.e., there can be a plurality of solid state light emitters of one type, or one or more solid state light emitters of each of two or more types).

The one or more solid state light emitters can be combined with one or more light emitters of any other type, if desired, e.g., one or more incandescent light, one or more fluorescent light, etc.

As indicated above, the lighting devices according to the present inventive subject matter can comprise any desired number of solid state emitters. For example, a lighting device according to the present inventive subject matter can include a single light emitting diode; or 50 or more light emitting diodes, or can include 1000 or more light emitting diodes, etc.

As noted above, one type of solid state light emitter which can be employed are LEDs. Such LEDs can be selected from among any light emitting diodes (a wide variety of which are readily obtainable and well known to those skilled in the art, and therefore it is not necessary to describe in detail such devices, and/or the materials out of which such devices are made). For instance, examples of types of light emitting diodes include inorganic and organic light emitting diodes, a variety of each of which are well-known in the art.

The substantially transparent heat sink can be made of any material (or combination of materials) (1) which is transparent or which can be made to become transparent, and (2) which is a good conductor of heat (e.g., having a heat conductivity of at least 1 W/m-K. Representative examples of suitable materials include aluminum nitride (AlN), silicon carbide (SiC), diamond, diamond-like carbon (DLC), any of a variety of transparent polymeric materials, any of a variety of ceramic materials, any of a variety of crystalline materials, any of a variety of polycrystalline or amorphous materials, and any of a variety of glass materials. Alternatively, the substantially transparent heat sink can comprise a substantially transparent material (which can have a moderate heat conductivity or a lower heat conductivity, such as glass) and one or more elements of higher heat conducting capability (e.g., one or more wires, bars, layers, particles, regions and/or slivers) positioned within the substantially transparent material.

The substantially transparent heat sink can consist of a single heat sink element, or it can comprise a plurality of heat sink elements.

The substantially transparent heat sink can be of any desired shape. In some embodiments of the present inventive subject matter, the substantially transparent heat sink has a shape which provides a relatively large surface area (e.g., a surface area of at least 10 mm². As described below, the substantially transparent heat sink can take a wide variety of shapes, including shapes which would be expected to refract light in many complicated ways. With any of the lighting devices according to the present inventive subject matter, particularly those that include substantially transparent heat sinks which refract light in complicated ways, persons of skill in the art are familiar with experimenting with and adjusting light refracting shapes so as to achieve desired light focusing, light directing, and/or light mixing properties, including mixing of light of differing hues.

The heat sink can be in the form of a solid, whereby it can be incorporated into a lighting device in its desired shape, and can, if desired, comprise precisely positioned elements of increased heat conductivity.

The substantially transparent heat sink can, if desired, include one or more optical features formed on its surface and/or within. As used herein, the expression "optical feature" refers to a three dimensional shape that has a contour which differs from the contour of the immediate surroundings, or to a pattern of shapes that has a contour which differs from the contour of the immediate surrounding. The size of such contour can be nano, micro, or macro in size or scale. A pattern of optical features can be any suitable pattern for providing a desired diffusion and/or mixing of light. The pattern can be repeating, pseudo-random or random. The expression "pseudo-random" means a pattern which includes one or more types of random sub-patterns which are repeated. The expression "random" means a pattern which does not include any substantial regions which are repeated. Persons of skill in the art are familiar with a wide variety of optical features as defined herein, and any such optical features can be employed in the lighting devices according to the present inventive subject matter.

In some embodiments of the present inventive subject matter, the substantially transparent heat sink is in direct contact with the at least one solid state light emitter. In some embodiments, the substantially transparent heat sink is in thermal contact with at least one solid state light emitter via a heat pipe.

In some embodiments of the present inventive subject matter, the substantially transparent heat sink completely surrounds the at least one solid state light emitter.

In some embodiments of the present inventive subject matter, the substantially transparent heat sink completely surrounds and is in direct contact with all surfaces of the at least one solid state light emitter.

As noted above, in some embodiments according to the present inventive subject matter, the lighting device further comprises at least one luminescent material. The luminescent material can be provided in any desired form, skilled artisans being familiar with a wide variety of luminescent materials and forms. For example, the luminescent material can be applied as a layer of particles, and/or can be provided in the form of a lumiphor, i.e., a solid element in which one or more luminescent material is dispersed (persons of skill in the art are familiar with a wide variety of lumiphors).

In some embodiments, luminescent material (e.g., phosphor), if employed, can be spaced from the one or more solid state light emitters (i.e., a "remote" luminescent material).

For example, luminescent material can be coated on a surface of the heat sink. In such embodiments, the luminescent material can remain cooler, as it is spaced from the light emitter(s), which are a source (or sources) of heat.

Luminescent material (or materials), if employed, can be selected from among phosphors, scintillators, day glow tapes, inks which glow in the visible spectrum upon illumination with ultraviolet light, etc. The one or more luminescent materials can be down-converting or up-converting, or can include a combination of both types.

The lighting devices according to the present inventive subject matter can, if desired, further comprise one or more clear encapsulant (comprising, e.g., one or more silicone materials, epoxy materials, glass materials or metal oxide materials) positioned in any desired way, e.g., over the solid state light emitter or between the solid state light emitter and a lumiphor (if provided). Persons of skill in the art are familiar with a wide variety of encapsulant formulations and shapes, and any such formulations and shapes can be employed in accordance with the present inventive subject matter.

The lighting devices according to the present inventive subject matter can also comprise one or more additives, a wide variety of which are well known to persons of skill in the art, e.g., diffusers, scatterers, tints, etc. In some embodiments, any of such additives can be contained in a substantially transparent heat sink, in a lumiphor and/or in an encapsulant.

The lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources.

For example, fixtures, other mounting structures and complete lighting assemblies which may be used in practicing the present inventive subject matter are described in:

U.S. Patent Application No. 60/752,753, filed on Dec. 21, 2005, entitled "LIGHTING DEVICE" (inventors: Gerald H. Negley, Antony Paul van de Ven and Neal Hunter) and U.S. patent application Ser. No. 11/613,692, filed Dec. 20, 2006 (now U.S. Patent Publication No. 2007/0139923), the entireties of which are hereby incorporated by reference;

U.S. Patent Application No. 60/798,446, filed on May 5, 2006, entitled "LIGHTING DEVICE" (inventor: Antony Paul van de Ven) and U.S. patent application Ser. No. 11/743,754, filed May 3, 2007 (now U.S. Patent Publication No. 2007/0263393), the entireties of which are hereby incorporated by reference;

U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman) and U.S. patent application Ser. No. 11/755,153, filed May 30, 2007 (now U.S. Patent Publication No. 2007/0279903), the entireties of which are hereby incorporated by reference;

U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), and U.S. patent application Ser. No. 11/856,421, filed Sep. 17, 2007 (now U.S. Patent Publication No. 2008/0084700), the entireties of which are hereby incorporated by reference;

U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), and U.S. patent application Ser. No. 11/859,048, filed Sep. 21, 2007 (now U.S. Patent Publication No. 2008/0084701), the entireties of which are hereby incorporated by reference;

U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley) and U.S. patent application Ser. No. 11/939,047, filed Nov. 13, 2007 (now U.S. Patent Publication No. 2008/0112183), the entireties of which are hereby incorporated by reference;

U.S. Patent Application No. 60/858,881, filed on Nov. 14, 2006, entitled "LIGHT ENGINE ASSEMBLIES" (inventors: Paul Kenneth Pickard and Gary David Trott) and U.S. patent application Ser. No. 11/939,052, filed Nov. 13, 2007 (now U.S. Patent Publication No. 2008/0112168), the entireties of which are hereby incorporated by reference;

U.S. Patent Application No. 60/859,013, filed on Nov. 14, 2006, entitled "LIGHTING ASSEMBLIES AND COMPONENTS FOR LIGHTING ASSEMBLIES" (inventors: Gary David Trott and Paul Kenneth Pickard) and U.S. patent application Ser. No. 11/939,059, filed Apr. 18, 2007 (now U.S. Patent Publication No. 2008/0112170), the entireties of which are hereby incorporated by reference;

U.S. Patent Application No. 60/853,589, filed on Oct. 23, 2006, entitled "LIGHTING DEVICES AND METHODS OF INSTALLING LIGHT ENGINE HOUSINGS AND/OR TRIM ELEMENTS IN LIGHTING DEVICE HOUSINGS" (inventors: Gary David Trott and Paul Kenneth Pickard) and U.S. patent application Ser. No. 11/877,038, filed Oct. 23, 2007 (now U.S. Patent Publication No. 2008/0106907), the entireties of which are hereby incorporated by reference;

U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference;

U.S. Patent Application No. 60/916,384, filed on May 7, 2007, entitled "LIGHT FIXTURES, LIGHTING DEVICES, AND COMPONENTS FOR THE SAME" (inventors: Paul Kenneth Pickard, Gary David Trott and Ed Adams), and U.S. patent application Ser. No. 11/948,041, filed Nov. 30, 2007 (now U.S. Patent Publication No. 2008/0137347)(inventors: Gary David Trott, Paul Kenneth Pickard and Ed Adams), the entireties of which are hereby incorporated by reference;

U.S. Patent Application No. 60/916,030, filed on May 4, 2007, entitled "LIGHTING FIXTURE" (inventors: "Paul Kenneth Pickard, James Michael LAY and Gary David Trott) and U.S. patent application Ser. No. 12/114,994, filed May 5, 2008 (now U.S. Patent Publication No. 2008/0304269), the entireties of which are hereby incorporated by reference;

U.S. Patent Application No. 60/916,407, filed on May 7, 2007, entitled "LIGHT FIXTURES AND LIGHTING DEVICES" (inventors: Gary David Trott and Paul Kenneth Pickard), and U.S. patent application Ser. No. 12/116,341, filed May 7, 2008 (now U.S. Patent Publication No. 2008/0278952), the entireties of which are hereby incorporated by reference;

U.S. Patent Application No. 61/029,068, filed on Feb. 15, 2008, entitled "LIGHT FIXTURES AND LIGHTING DEVICES" (inventors: Paul Kenneth Pickard and Gary David Trott), U.S. Patent Application No. 61/037,366, filed on Mar. 18, 2008, and U.S. patent application Ser. No. 12/116, 346, filed May 7, 2008 (now U.S. Patent Publication No. 2008/0278950), the entireties of which are hereby incorporated by reference; and U.S. patent application Ser. No. 12/116,348, filed on May 7, 2008 (now U.S. Patent Publication No. 2008/0278950), entitled "LIGHT FIXTURES AND LIGHTING DEVICES" (inventors: Paul Kenneth Pickard and Gary David), the entirety of which is hereby incorporated by reference.

Representative examples of circuitry which may be used in practicing the present inventive subject matter is described in:

U.S. Patent Application No. 60/809,959, filed on Jun. 1, 2006, entitled "LIGHTING DEVICE WITH COOLING" (inventors: Thomas G. Coleman, Gerald H. Negley and Antony Paul van de Ven) and U.S. patent application Ser. No. 11/626, 483, filed Jan. 24, 2007 (now U.S. Patent Publication No. 2008/0171145), the entireties of which are hereby incorporated by reference;

U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007 (now U.S. Patent Publication No. 2008/0279440), the entireties of which are hereby incorporated by reference;

U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007 (now U.S. Patent Publication No. 2008/0088248), entitled "CIRCUITRY FOR SUPPLYING ELECTRICAL POWER TO LOADS", the entireties of which are hereby incorporated by reference;

U.S. Patent Application No. 60/943,910, filed on Jun. 14, 2007, entitled "DEVICES AND METHODS FOR POWER CONVERSION FOR LIGHTING DEVICES WHICH INCLUDE SOLID STATE LIGHT EMITTERS" (inventor: Peter Jay Myers), and U.S. patent application Ser. No. 12/117,280, filed May 8, 2008 (now U.S. Patent Publication No. 2008/0309255), the entireties of which are hereby incorporated by reference; and U.S. Patent Application No. 61/022,886, filed on Jan. 23, 2008, entitled "FREQUENCY CONVERTED DIMMING SIGNAL GENERATION" (inventors: Peter Jay Myers, Michael Harris and Terry Given) and U.S. Patent Application No. 61/039,926, filed Mar. 27, 2008, the entireties of which are hereby incorporated by reference.

Some embodiments according to the present inventive subject matter further comprise one or more heat spreader. A heat spreader typically has a heat conductivity which is higher that the heat conductivity of the substantially transparent heat sink. For example, in some embodiments of the present inventive subject matter, a heat spreader is provided in order for heat to be spread out into a larger surface area from which it can be dissipated through the substantially transparent heat sink and/or other structure.

Representative examples of materials out of which a heat spreader (if provided) can be made include copper, aluminum, diamond and DLC. A heat spreader (if provided) can be of any desired shape.

In some embodiments according to the present inventive subject matter, the substantially transparent heat sink comprises at least one substantially transparent region having a first heat conductivity and at least one thermal transfer region having a second heat conductivity, the second heat conductivity being greater than the first heat conductivity. The thermal transfer region (or regions) can be made of any suitable material, and can be of any desired shape. Use of materials having higher heat conductivity in making the thermal transfer region(s) generally provides greater heat transfer, and use of thermal transfer region(s) of larger surface area and/or cross-sectional area generally provides greater heat transfer, but might block the passage of more light. Representative examples of materials which can be used to make the thermal transfer region(s), if provided, include metals, diamond, DLC, etc. Representative examples of shapes in which the thermal transfer region(s), if provided, can be formed include bars (which may extend completely across the substantially transparent heat sink or only partially, e.g., cantilevered, across the substantially transparent heat sink), crossbars, wires and/or wire patterns. The thermal transfer region(s), if included, can also function as one or more electrical terminals for carrying electricity to the one or more solid state light emitters.

Some embodiments according to the present inventive subject matter further comprise one or more printed circuit boards, on which the one or more solid state light emitters can be mounted. Persons of skill in the art are familiar with a wide variety of circuit boards, and any such circuit boards can be employed in the lighting devices according to the present inventive subject matter. One representative example of a circuit board with a relatively high heat conductivity is a metal core printed circuit board.

Some embodiments according to the present inventive subject matter further comprise one or more lenses. Persons of skill in the art are familiar with a wide variety of lenses for lighting devices (e.g., Fresnel lenses, prismatic lenses and dome recycling lenses), and any such lenses can be employed in the lighting devices according to the present inventive subject matter. Such a lens (or lenses) can be provided as a separate component, or can be provided as part of, or integral with, the substantially transparent heat sink.

The lighting devices of the present inventive subject matter can be arranged in generally any desired orientation, a variety of which are well known to persons skilled in the art. For example, the lighting device can be back-reflecting device or a front-emitting device.

Persons of skill in the art are familiar with back-reflecting devices, e.g., as disclosed in U.S. Pat. No. 6,578,998, U.S. Pat. No. 5,924,785 and U.S. Pat. No. 7,246,921, the entireties of which are hereby incorporated herein by reference.

Persons of skill in the art are also familiar with front-emitting devices, e.g., lighting devices in which light exits the lighting device in the same general direction (e.g., "up" or "down") as it is emitted from the one or more solid state light emitter.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Figure 2:
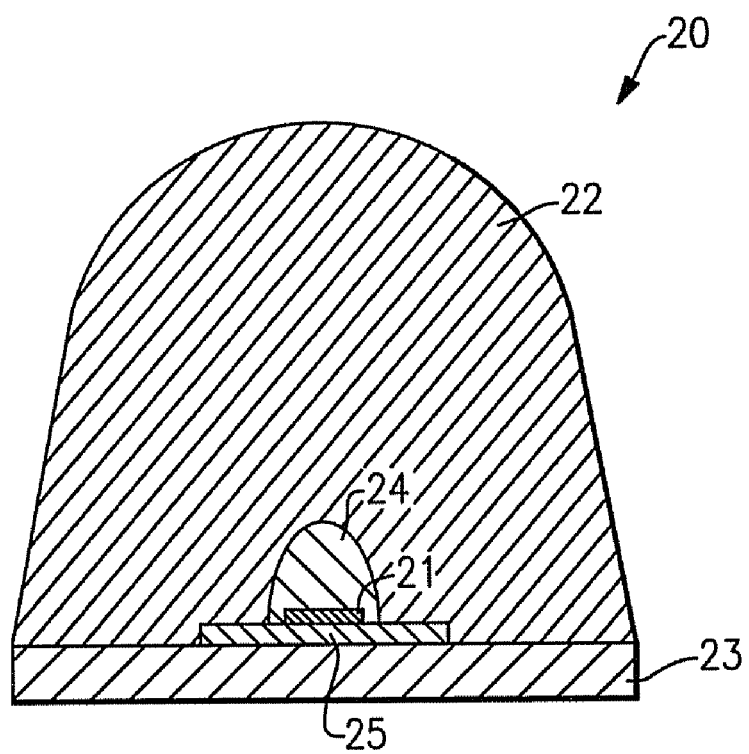
FIG. 2 depicts a first embodiment of a lighting device according to the present inventive subject matter.

FIG. 2 depicts a first embodiment of a lighting device 20 according to the present inventive subject matter. Referring to FIG. 2, the lighting device 20 comprises a solid state light emitter chip 21, a substantially transparent heat sink 22 formed of a solid material, a heat spreader 23 formed of aluminum, an encapsulant 24 and a printed circuit board 25.

Figure 3:
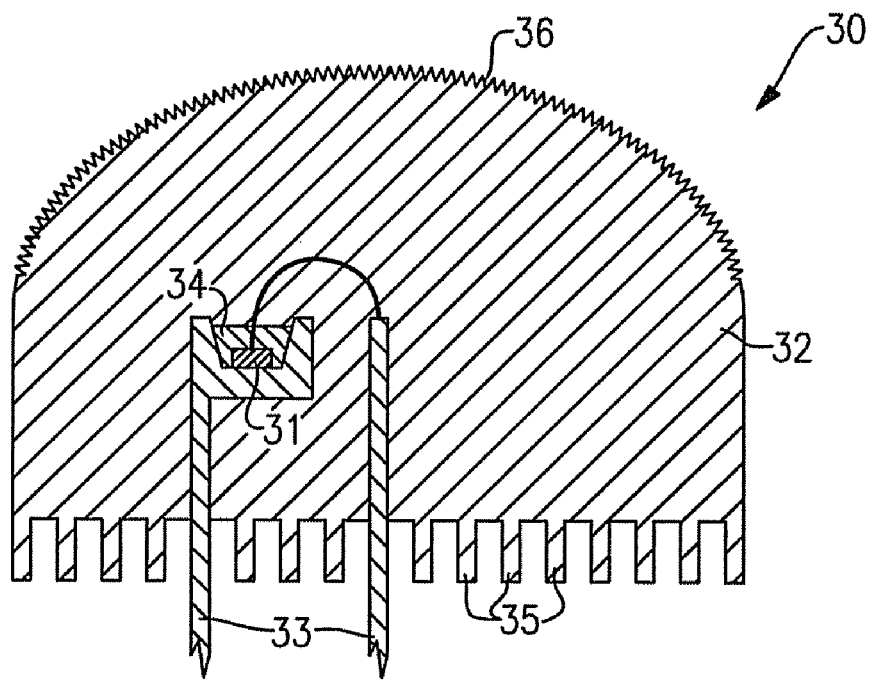
FIG. 3 depicts a second embodiment of a lighting device according to the present inventive subject matter.

FIG. 3 depicts a second embodiment of a lighting device 30 according to the present inventive subject matter. Referring to FIG. 3, the lighting device 30 comprises a solid state light emitter chip 31, a substantially transparent heat sink 32 formed of a solid material, a leadframe 33 and a lumiphor 34. The substantially transparent heat sink comprises fins 35 and an optical feature 36.

Figure 4:
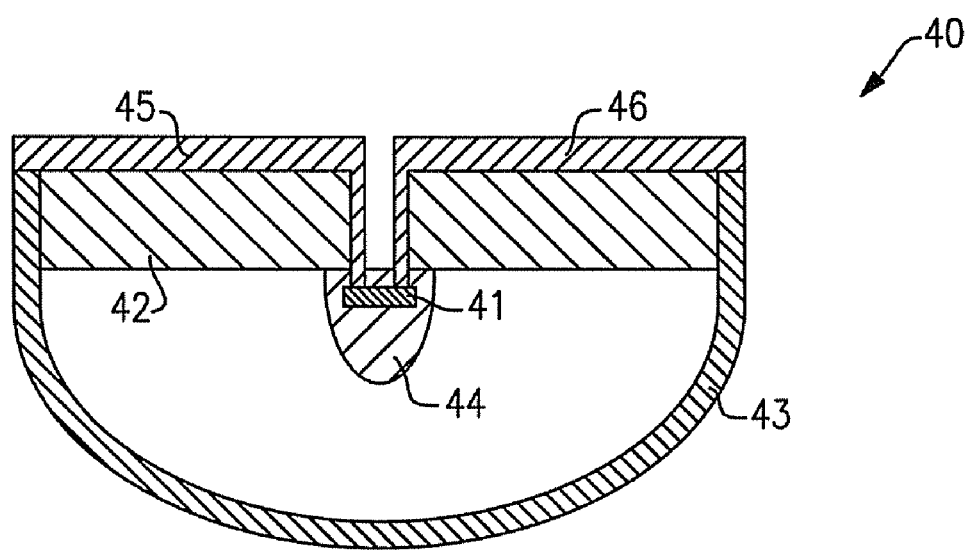
FIG. 4 depicts a third embodiment of a lighting device according to the present inventive subject matter.

FIG. 4 depicts a third embodiment of a lighting device 40 according to the present inventive subject matter. The lighting device 40 is a back-reflecting lighting device. Referring to FIG. 4, the lighting device 40 comprises a solid state light emitter chip 41, a substantially transparent heat sink 42 formed of a solid material, a back-reflector 43 made of reflective surface material, an encapsulant 44, a negative terminal 45 and a positive terminal 46.

Figure 5:
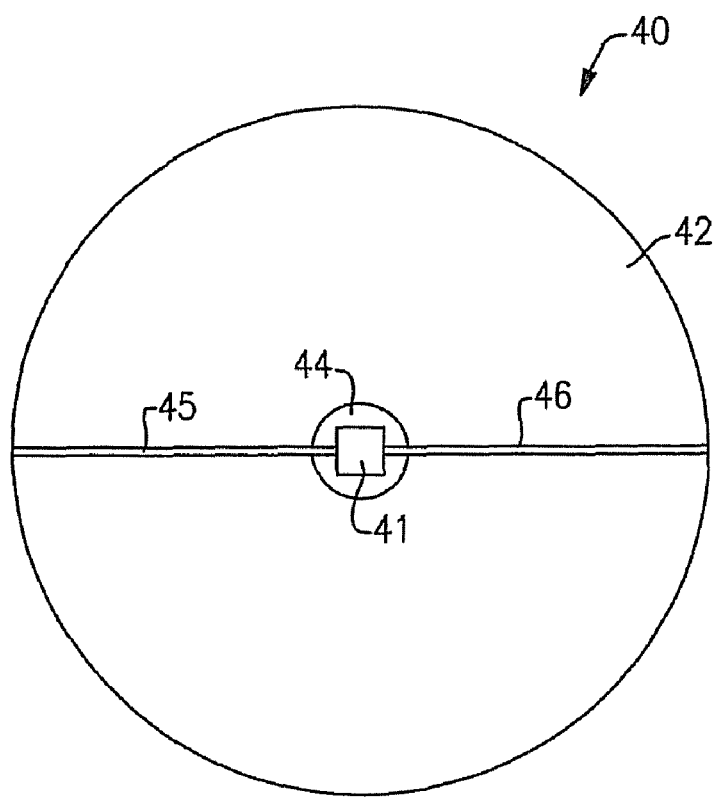
FIG. 5 is a top view of the lighting device depicted in FIG. 4.

FIG. 5 is a top view of the lighting device 40 depicted in FIG. 4.

Figure 6:
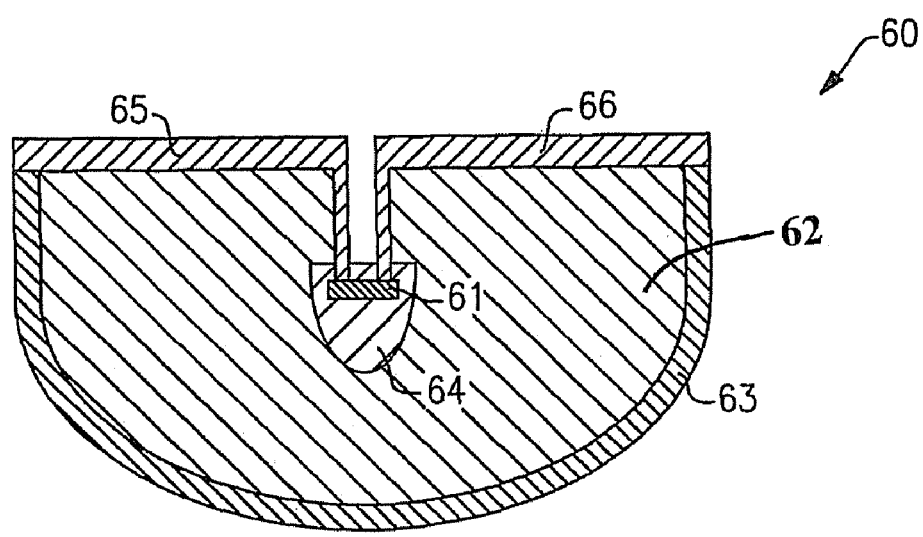
FIG. 6 depicts a fourth embodiment of a lighting device according to the present inventive subject matter.

FIG. 6 depicts a fourth embodiment of a lighting device 60 according to the present inventive subject matter. The lighting device 60 is similar to the lighting device 40 (the lighting device 60 comprises a solid state light emitter chip 61, a substantially transparent heat sink 62 formed of a solid material, a back-reflector 63 made of reflective surface material, an encapsulant 64, a negative terminal 65 and a positive terminal 66), except that in the lighting device 60, the substantially transparent heat sink 62 extends to and is in contact with the back-reflector 63.

Figure 7:
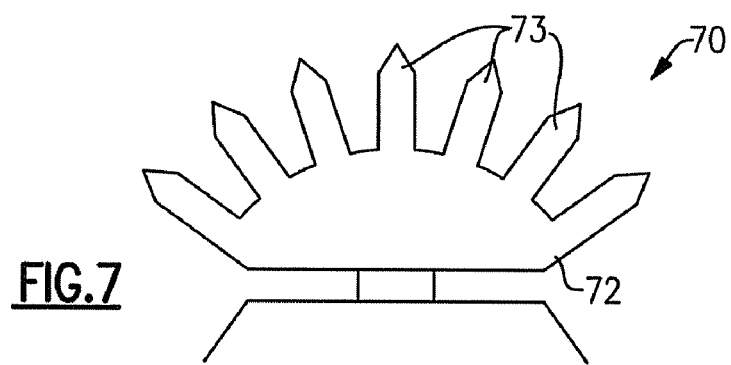
FIG. 7 depicts an embodiment of a portion of a lighting device according to the present inventive subject matter.

FIG. 7 depicts an embodiment of a portion of a lighting device 70 according to the present inventive subject matter. Referring to FIG. 7, the lighting device 70 comprises a substantially transparent heat sink 72 which comprises fins 73.

Figure 8:
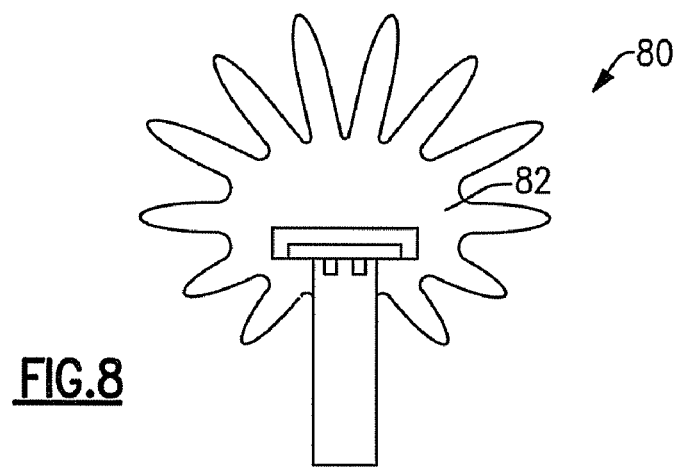
FIG. 8 depicts another embodiment of a portion of a lighting device according to the present inventive subject matter.

FIG. 8 depicts another embodiment of a portion of a lighting device 80 according to the present inventive subject matter. Referring to FIG. 8, the lighting device 80 comprises a substantially transparent heat sink 82 formed of a solid material which has a high surface area relative to its volume.

Figure 9:
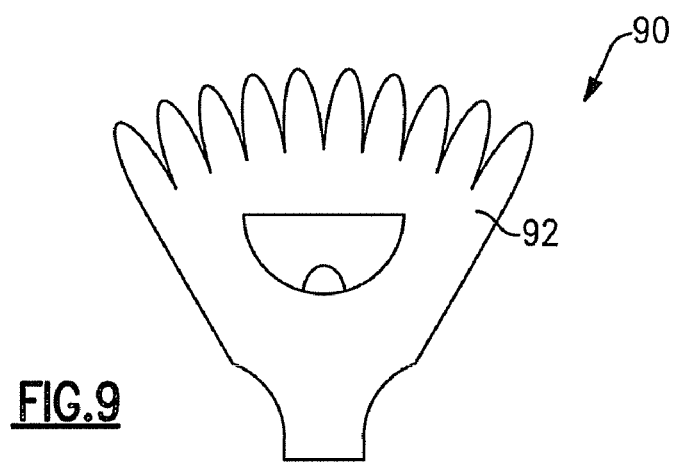
FIG. 9 depicts another embodiment of a portion of a lighting device according to the present inventive subject matter.

FIG. 9 depicts another embodiment of a portion of a lighting device 90 according to the present inventive subject matter. Referring to FIG. 9, the lighting device 90 comprises a substantially transparent heat sink 92 formed of a solid material which has a high surface area relative to its volume.

Figure 10:
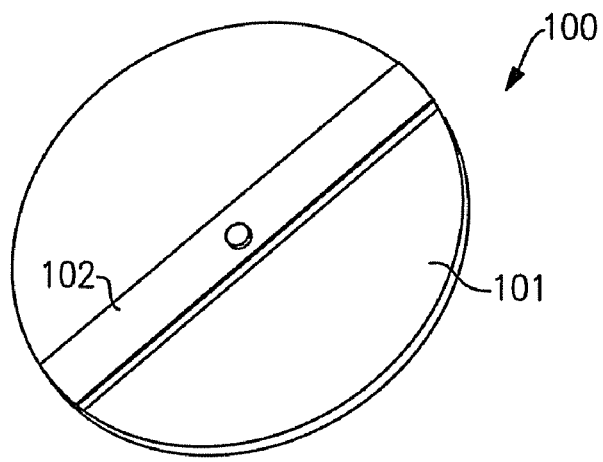
FIG. 10 depicts an embodiment of a substantially transparent heat sink.

FIG. 10 depicts an embodiment of a substantially transparent heat sink 100 formed of a solid material which comprises a substantially transparent region 101 and a thermal transfer region in the form of a heat conducting bar 102 formed of a second material of high thermal conductivity.

Figure 11:
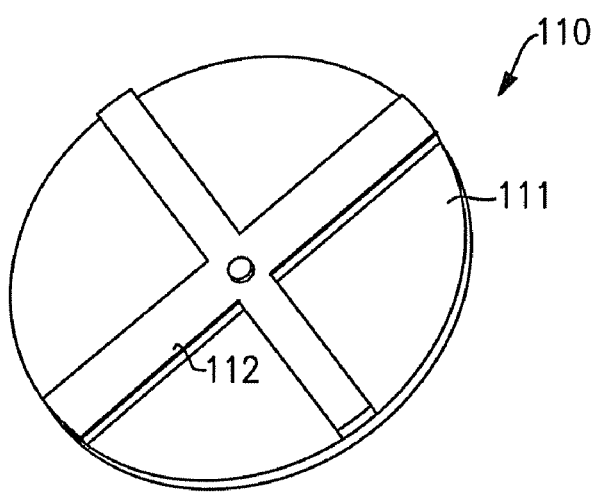
FIG. 11 depicts another embodiment of a substantially transparent heat sink.

FIG. 11 depicts an embodiment of a substantially transparent heat sink 110 formed of a solid material which comprises a substantially transparent region 111 and a thermal transfer region in the form of a heat conducting cross bar 112 formed of a second material of high thermal conductivity.

Figure 12:
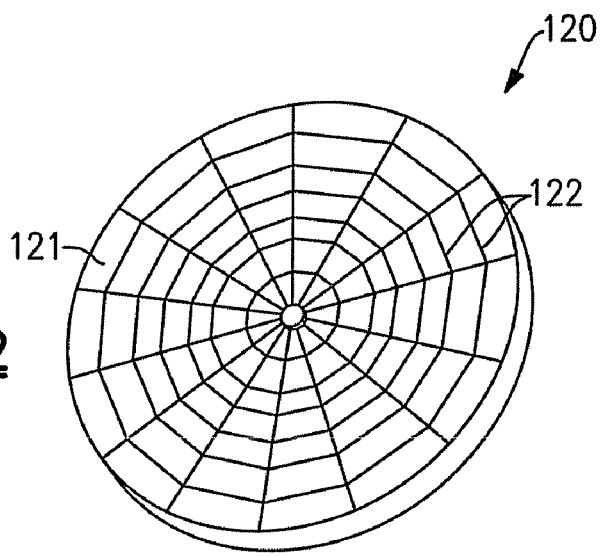
FIG. 12 depicts another embodiment of a substantially transparent heat sink.

FIG. 12 depicts an embodiment of a substantially transparent heat sink 120 formed of a solid material which comprises a substantially transparent region 121 and thermal transfer regions in the form of a plurality of heat conducting wires 122.

Figure 13:
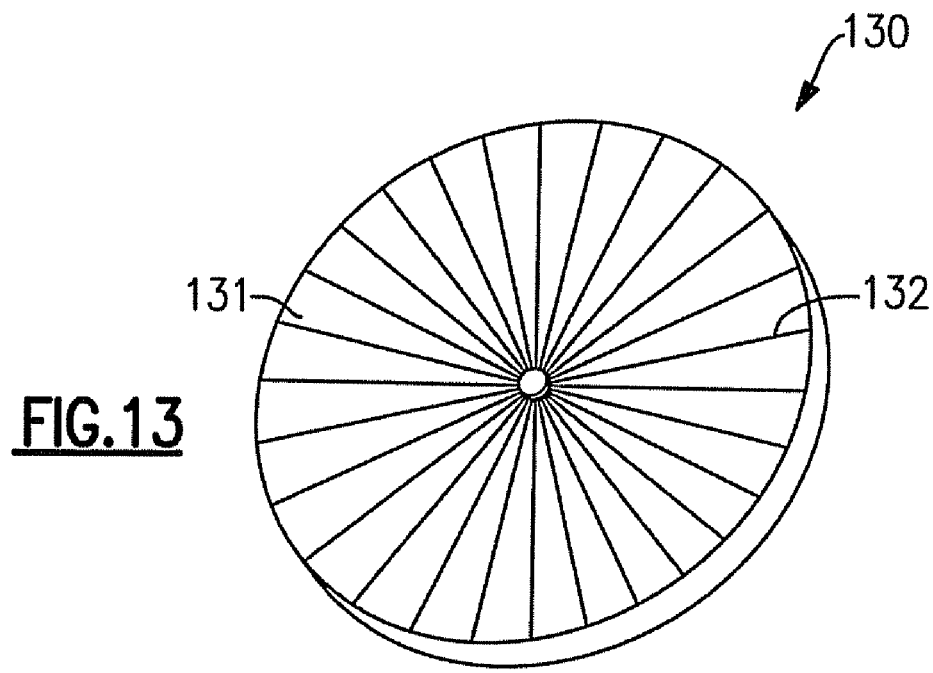
FIG. 13 depicts another embodiment of a substantially transparent heat sink.

FIG. 13 depicts an embodiment of a substantially transparent heat sink 130 formed of a solid material which comprises a substantially transparent region 131 and thermal transfer regions in the form of a plurality of heat conducting wires 132.

Figure 14:
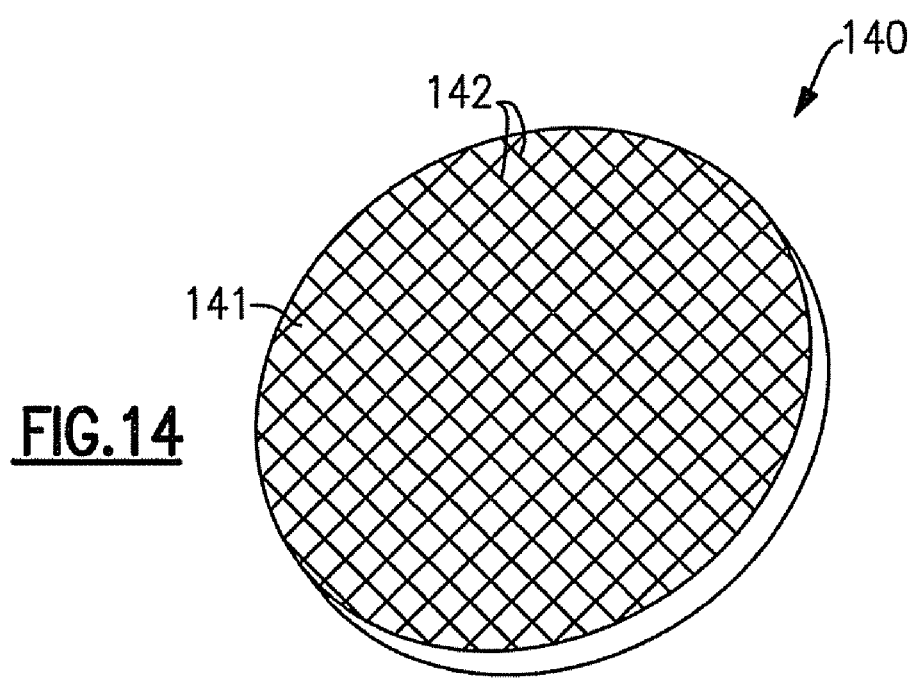
FIG. 14 depicts another embodiment of a substantially transparent heat sink.

FIG. 14 depicts an embodiment of a substantially transparent heat sink 140 formed of a solid material which comprises a substantially transparent region 141 and thermal transfer regions in the form of a plurality of heat conducting wires 142.

Figure 15:
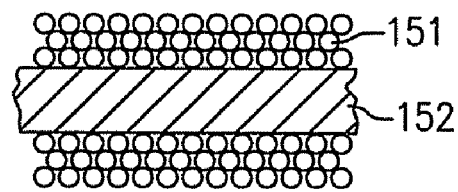
FIG. 15 depicts a close-up view of any of the embodiments depicted in FIGS. 12-14.

FIG. 15 depicts a close-up sectional view of any of the embodiments depicted in FIGS. 12-14, comprising a substantially transparent region 151 formed of submicron ceramic alumina and a wire 152.

Figure 16:
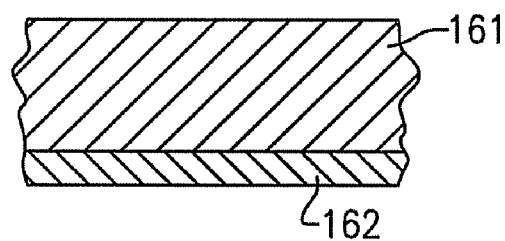
FIG. 16 depicts a close-up view of a substantially transparent region.

FIG. 16 depicts a close-up view of a substantially transparent region 161 formed of glass and conductive diamond, graphene-graphite edging 162.

Figure 17:
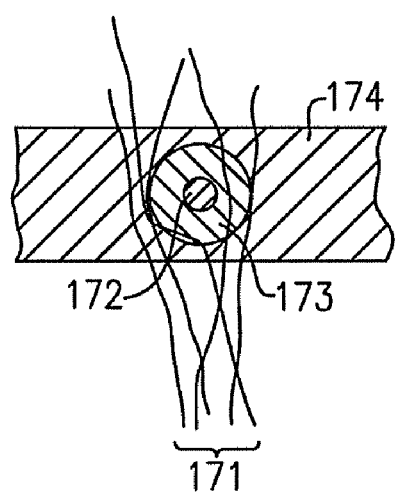
FIG. 17 depicts a close-up view using a variable refractive index transparent material to refract light around a non-transparent element rendering it invisible to the light emitted.

FIG. 17 depicts a close-up view showing the use of a variable refractive index or negative refractive index material surrounding a wire 172 (thermal material) to allow light to be bent around the wire. The curved lines 171 in FIG. 17 are light rays being bent around the embedded wire 172. In this embodiment, the wire 172 can be coated with a clear material 173 having a variable or negative refractive index such that the light is bent around the wire, thus making the wire invisible (such being possible with the availability of materials of different refractive indices, including negative indices). The clear material 173 can be surrounded by glass 174.

Any two or more structural parts of the lighting devices described herein can be integrated. Any structural part of the lighting devices described herein can be provided in two or more parts.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device, comprising:
   at least a first solid state light emitter; and
   a substantially transparent heat sink,
   said heat sink and said first solid state light emitter positioned and oriented relative to one another such that if said solid state light emitter is illuminated, substantially all the light that is emitted by said first solid state light emitter and that exits the lighting device passes through said substantially transparent heat sink.

2. A lighting device as recited in claim 1, wherein said heat sink has a heat conductivity of at least 1 W/m-K.

3. A lighting device as recited in claim 1, wherein said heat sink has a surface area of at least 10 mm$^2$.

4. A lighting device as recited in claim 1, wherein said heat sink comprises at least one heat sink element.

5. A lighting device as recited in claim 1, wherein said lighting device further comprises at least one luminescent material.

6. A lighting device as recited in claim 1, wherein said lighting device further comprises at least one encapsulant, said encapsulant in contact with said solid state light emitter.

7. A lighting device as recited in claim 1, wherein said lighting device further comprises at least one heat spreader, said heat spreader having a heat spreader heat conductivity which is higher than a heat conductivity of said heat sink.

8. A lighting device as recited in claim 1, wherein at least one portion of a surface of said heat sink comprises an optical feature.

9. A lighting device as recited in claim 1, wherein:
   said lighting device further comprises a printed circuit board, and
   said solid state light emitter is on said printed circuit board.

10. A lighting device as recited in claim 1, wherein said lighting device is a back-reflecting device.

11. A lighting device as recited in claim 1, wherein said lighting device is a front-emitting device.

12. A lighting device as recited in claim 1, wherein said heat sink comprises at least one substantially transparent region having a first heat conductivity and at least one thermal transfer region having a second heat conductivity, said second heat conductivity greater than said first heat conductivity.

13. A lighting device as recited in claim 12, wherein said thermal transfer region comprises metal.

14. A lighting device as recited in claim 12, wherein said thermal transfer region comprises at least one bar.

15. A lighting device as recited in claim 12, wherein said thermal transfer region comprises at least one crossbar.

16. A lighting device as recited in claim 12, wherein said thermal transfer region comprises at least one wire.

17. A lighting device as recited in claim 12, wherein said thermal transfer region also functions as an electrical terminal.

18. A lighting device as recited in claim 1, wherein a surface of said solid state light emitter defines a first plane and substantially all of said transparent heat sink is on one side of said first plane.

19. A lighting device, comprising:
   at least a first solid state light emitter;
   a substantially transparent heat sink; and
   a heat spreader;
   said heat sink and said first solid state light emitter positioned and oriented relative to one another such that if said first solid state light emitter is illuminated, light emitted by said first solid state light emitter which exits the lighting device passes through at least a portion of said heat sink;

said substantially transparent heat sink on a first side of said solid state light emitter and said heat spreader on a second side of said solid state light emitter.

20. A lighting device as recited in claim 19, wherein said heat sink has a heat conductivity of at least 1 W/m-K.

21. A lighting device as recited in claim 19, wherein said heat sink has a surface area of at least 10 mm$^2$.

22. A lighting device as recited in claim 19, wherein if said solid state light emitter is illuminated, substantially all light emitted by said solid state light emitter which exits said lighting device passes through at least a portion of said heat sink.

23. A lighting device as recited in claim 19, wherein said heat sink comprises at least one heat sink element.

24. A lighting device as recited in claim 19, wherein said lighting device further comprises at least one luminescent material.

25. A lighting device as recited in claim 19, wherein said lighting device further comprises at least one encapsulant, and said encapsulant is in contact with said solid state light emitter.

26. A lighting device as recited in claim 19, wherein said heat spreader has a heat spreader heat conductivity which is higher than a heat conductivity of said heat sink.

27. A lighting device as recited in claim 19, wherein at least one portion of a surface of said heat sink comprises an optical feature.

28. A lighting device as recited in claim 19, wherein said lighting device further comprises a printed circuit board, and said solid state light emitter is mounted on said printed circuit board.

29. A lighting device as recited in claim 19, wherein said lighting device is a back-reflecting device.

30. A lighting device as recited in claim 19, wherein said lighting device is a front-emitting device.

31. A lighting device as recited in claim 19, wherein said heat sink comprises at least one substantially transparent region having a first heat conductivity and at least one thermal transfer region having a second heat conductivity, said second heat conductivity greater than said first heat conductivity.

32. A lighting device as recited in claim 31, wherein said thermal transfer region comprises metal.

33. A lighting device as recited in claim 31, wherein said thermal transfer region comprises at least one bar.

34. A lighting device as recited in claim 31, wherein said thermal transfer region comprises at least one crossbar.

35. A lighting device as recited in claim 31, wherein said thermal transfer region comprises at least one wire.

36. A lighting device as recited in claim 31, wherein said thermal transfer region also functions as an electrical terminal.

37. A lighting device as recited in claim 19, wherein a surface of said first solid state light emitter defines a first plane and substantially all of said transparent heat sink is on one side of said first plane.

38. A lighting device, comprising:
at least one solid state light emitter; and
means for extracting heat from said solid state light emitter.

39. A lighting device as recited in claim 38, wherein said means for extracting heat has a heat conductivity of at least 1 W/m-K.

40. A lighting device as recited in claim 38, wherein said means for extracting heat has a surface area of at least 10 mm$^2$.

41. A lighting device as recited in claim 38, wherein if said solid state light emitter is illuminated, substantially all light emitted by said solid state light emitter which exits said lighting device passes through at least a portion of said means for extracting heat.

42. A lighting device as recited in claim 38, wherein said means for extracting heat comprises at least one heat sink element.

43. A lighting device as recited in claim 38, wherein said lighting device further comprises at least one luminescent material.

44. A lighting device as recited in claim 38, wherein said lighting device further comprises at least one encapsulant, and said encapsulant is in contact with said solid state light emitter.

45. A lighting device as recited in claim 38, wherein said lighting device further comprises at least one heat spreader, said heat spreader having a heat spreader heat conductivity which is higher than a heat conductivity of said means for extracting heat.

46. A lighting device as recited in claim 38, wherein at least one portion of a surface of said means for extracting heat comprises an optical feature.

47. A lighting device as recited in claim 38, wherein said lighting device further comprises a printed circuit board, said solid state light emitter on said printed circuit board.

48. A lighting device as recited in claim 38, wherein said lighting device is a back-reflecting device.

49. A lighting device as recited in claim 38, wherein said lighting device is a front-emitting device.

50. A lighting device as recited in claim 38, wherein said means for extracting heat comprises at least one substantially transparent region having a first heat conductivity and at least one thermal transfer region having a second heat conductivity, said second heat conductivity greater than said first heat conductivity.

51. A lighting device as recited in claim 50, wherein said thermal transfer region comprises metal.

52. A lighting device as recited in claim 50, wherein said thermal transfer region comprises at least one bar.

53. A lighting device as recited in claim 50, wherein said thermal transfer region comprises at least one crossbar.

54. A lighting device as recited in claim 50, wherein said thermal transfer region comprises at least one wire.

55. A lighting device as recited in claim 50, wherein said thermal transfer region also functions as an electrical terminal.

56. A lighting device, comprising:
at least a first solid state light emitter;
at least one substantially transparent heat sink;
at least one reflective element; and
at least a first electrical conductor, at least a portion of which is electrically conductive;
the at least one reflective element and the substantially transparent heat sink in combination substantially surrounding the solid state light emitter, except where the at least one electrical conductor extends through the substantially transparent heat sink.

57. A lighting device as recited in claim 56, wherein substantially all of the light emitted by said first solid state light emitter that exits said lighting device passes through at least a portion of said transparent heat sink.

58. A lighting device, comprising:
at least a first solid state light emitter;
at least one substantially transparent heat sink;
at least one encapsulant;
at least one reflective element; and at least a first electrical conductor, at least a portion of which is electrically conductive;

the at least one reflective element, the at least one substantially transparent heat sink and the at least one encapsulant in combination substantially surrounding the solid state light emitter, except where the at least one electrical conductor extends through the substantially transparent heat sink.

59. A lighting device as recited in claim 58, wherein substantially all of the light emitted by the first solid state light emitter that exits the lighting device passes through at least a portion of the transparent heat sink.

60. A lighting device, comprising:

at least a first solid state light emitter;

a substantially transparent heat sink, at least some of the light emitted by the first solid state light emitter passing through the heat sink; and at least one electrical conductor electrically connected to the first solid state light emitter, at least a portion of the at least one electrical conductor is electrically conductive;

the at least one electrical conductor extends through said substantially transparent heat sink; and said solid state light emitter is substantially surrounded by said substantially transparent heat sink, except where the at least one electrical conductor extends through said substantially transparent heat sink.

* * * * *

UNITED STATES PATENT AND TRADEMARK OFFICE
CERTIFICATE OF CORRECTION

| | | |
|---|---|---|
| PATENT NO. | : 8,008,845 B2 | Page 1 of 1 |
| APPLICATION NO. | : 12/512653 | |
| DATED | : August 30, 2011 | |
| INVENTOR(S) | : Antony Paul Van De Ven and Gerald H. Negley | |

It is certified that error appears in the above-identified patent and that said Letters Patent is hereby corrected as shown below:

Title Page, Item [56]

*Line 5*: please change "(now U.S. Patent Publication No. 2008/0278950)" to

--(now U.S. Patent Publication No. 2008/0278957)--

Signed and Sealed this
Tenth Day of January, 2012

David J. Kappos
*Director of the United States Patent and Trademark Office*